(12) United States Patent
Mizumura

(10) Patent No.: US 12,303,998 B2
(45) Date of Patent: May 20, 2025

(54) LASER REPAIR METHOD AND LASER REPAIR DEVICE

(71) Applicant: V TECHNOLOGY CO., LTD., Kanagawa (JP)

(72) Inventor: Michinobu Mizumura, Kanagawa (JP)

(73) Assignee: V TECHNOLOGY CO., LTD., Kanagawa (JP)

(*) Notice: Subject to any disclaimer, the term of this patent is extended or adjusted under 35 U.S.C. 154(b) by 771 days.

(21) Appl. No.: 17/625,579

(22) PCT Filed: May 27, 2020

(86) PCT No.: PCT/JP2020/020969
§ 371 (c)(1),
(2) Date: Jan. 7, 2022

(87) PCT Pub. No.: WO2021/005907
PCT Pub. Date: Jan. 14, 2021

(65) Prior Publication Data
US 2022/0281029 A1   Sep. 8, 2022

(30) Foreign Application Priority Data
Jul. 11, 2019  (JP) ................................ 2019-129341

(51) Int. Cl.
*B23K 26/03*       (2006.01)
*B23K 26/064*     (2014.01)
(Continued)

(52) U.S. Cl.
CPC .......... *B23K 26/032* (2013.01); *B23K 26/064* (2015.10); *B23K 26/082* (2015.10);
(Continued)

(58) Field of Classification Search
None
See application file for complete search history.

(56) References Cited

U.S. PATENT DOCUMENTS

| | | |
|---|---|---|
| 2005/0168758 A1 | 8/2005 | Hayasaki et al. |
| 2006/0065645 A1 | 3/2006 | Nakasu et al. |
| | (Continued) | |

FOREIGN PATENT DOCUMENTS

| | | |
|---|---|---|
| CN | 101673666 A | 3/2010 |
| CN | 101726951 A | 6/2010 |
| | (Continued) | |

OTHER PUBLICATIONS

Office Action issued in corresponding Taiwanese Patent Application No. 109119444, dated Oct. 11, 2023 (11 pages).

(Continued)

*Primary Examiner* — John J Norton
(74) *Attorney, Agent, or Firm* — Osha Bergman Watanabe & Burton LLP

(57) ABSTRACT

Even in the case where an underlayer differs or a film thickness varies, high-quality repair is allowed to be performed.

When a laser repair method performs repair work by setting a laser irradiation area for a defect part of a multi-layer film substrate and irradiating the defect part with a laser beam under a set laser working condition, the laser repair method includes: identifying a peripheral region of a laser beam irradiation position; dividing the identified peripheral region into a plurality of divided regions for each common reflected light information; inferring a layer structure at the laser beam irradiation position from analogy based on an arrangement pattern of the divided regions positioned around the laser beam irradiation position; and setting the laser working condition of the laser beam to be emitted based on the layer structure inferred from analogy.

8 Claims, 10 Drawing Sheets

(51) Int. Cl.
　　*B23K 26/082*　　(2014.01)
　　*B23K 26/53*　　(2014.01)
　　*B23K 101/42*　　(2006.01)
　　*G01N 21/956*　　(2006.01)
　　*H05K 3/22*　　(2006.01)

(52) U.S. Cl.
　　CPC .......... *B23K 26/53* (2015.10); *G01N 21/956* (2013.01); *H05K 3/225* (2013.01); *B23K 2101/42* (2018.08)

(56) References Cited

U.S. PATENT DOCUMENTS

| 2007/0092128 | A1* | 4/2007 | Noy ........................ H05K 3/225 382/145 |
| 2007/0173039 | A1 | 7/2007 | Tagusa |
| 2008/0121891 | A1 | 5/2008 | Lee |
| 2015/0233762 | A1 | 8/2015 | Goldring et al. |

FOREIGN PATENT DOCUMENTS

| CN | 101673666 | B | | 11/2012 | | |
| CN | 102845132 | A | | 12/2012 | | |
| CN | 203409425 | U | | 1/2014 | | |
| CN | 109300116 | A | | 2/2019 | | |
| CN | 110678003 | A | * | 1/2020 | | |
| JP | H08-96136 | A | | 4/1996 | | |
| JP | H10-235490 | A | | 9/1998 | | |
| JP | 2005-217161 | A | | 8/2005 | | |
| JP | 2007-520874 | A | | 7/2007 | | |
| JP | 2008-085279 | A | | 4/2008 | | |
| JP | 2008-188638 | A | | 8/2008 | | |
| JP | 2008-281580 | A | | 11/2008 | | |
| JP | 2010064120 | A | * | 3/2010 | .......... | G02F 1/1303 |
| JP | 2011203710 | A | * | 10/2011 | .......... | G01N 21/956 |
| JP | 2016-528496 | A | | 9/2016 | | |
| KR | 2000-0016881 | A | | 3/2000 | | |
| KR | 101439758 | B1 | | 9/2014 | | |

OTHER PUBLICATIONS

Office Action issued in the counterpart Chinese Patent Application No. 202080050119.3, mailed Jan. 31, 2024 (16 pages).
Office Action issued in counterpart Korean Patent Application No. 10-2022-7000138 mailed Oct. 22, 2024 (12 pages).
International Search Report issued in corresponding International Application No. PCT/JP2020/020969 mailed Aug. 4, 2020 (5 pages).
Written Opinion issued in corresponding International Application No. PCT/JP2020/020969 mailed Aug. 4, 2020 (7 pages).

\* cited by examiner

LASER REPAIR METHOD AND LASER REPAIR DEVICE

TECHNICAL FIELD

The present invention relates to a laser repair method and a laser repair device.

BACKGROUND ART

In a manufacturing process of an FPD (Flat Panel Display) or the like, laser repair is performed after an inspection process and, in the laser repair, repair work is performed on a multi-layer film substrate such as a TFT (Thin Film Transistor) by irradiating a defect part identified in the inspection process with a laser beam. The shape of the defect part serving as a work object differs from one defect part to another and a working condition or the like needs to be changed correspondingly to each defect part, and hence the laser repair is usually performed by a manual operation of an operator having a high skill.

In contrast, it is proposed to automate part of a repair process by using image processing technique. In the conventional art, for example, a defect part is detected by checking a defect image in which a target portion to be inspected is photographed with a reference image which does not have a defect, and a work position and a work area for irradiating the detected defect with a laser beam are specified based on input instruction contents (see, e.g., PTL 1 shown below).

CITATION LIST

Patent Literature

[PTL 1] Japanese Patent Application Publication No. 2008-188638

SUMMARY OF INVENTION

Technical Problem

In the case where the laser repair is performed on the multi-layer film substrate by the manual operation, it is desired to work only the defect part without damaging a peripheral layer or an underlayer of the defect part. The operator is aware of the defect part identified in the inspection process and its peripheral layer structure, and determines a minimum work area from his/her own experience and performs an operation while appropriately selecting the working condition (laser work recipe) based on information on the layer structure of which the operator is aware. Accordingly, the operation takes a long time inevitably, and repair quality is influenced by the skill of the operator.

In addition, in the case where part of the repair process is automated by using the image processing technique as in the conventional art, information on the defect part and its peripheral layer structure is not obtained only from a two-dimensional image of a surface, and hence a work process is performed under a specific working condition also in the case where the underlayer differs or a layer thickness varies. Accordingly, there arises a problem that insufficient work or excessive work progresses and, as a result, repair ends in failure or high-quality repair cannot be performed.

In particular, in the case where a surface layer serving as a work object is a metal layer, reflected light on its surface does not include information on a layer under the metal layer in many cases. Consequently, work is performed under the same working condition even in the case where the underlayer structure differs, and there arises a problem that a difference in underlayer causes a difference in a manner in which the work is performed, and the work tends to be insufficient or excessive.

The present invention has been proposed in order to cope with such circumstances. That is, objects of the present invention include allowing automation of laser repair and improve operation efficiency to obtain constant repair quality without being influenced by a skill of an operator, and accurately inferring a difference in underlayer from analogy to allow high-quality repair to be performed even in the case where it is not possible to grasp the difference in underlayer only from information on reflected light.

Solution to Problem

In order to solve such problems, the present invention includes the following configurations.

A laser repair method which performs repair work by setting a laser irradiation area for a defect part of a multi-layer film substrate and irradiating the defect part with a laser beam under a set laser working condition, the laser repair method including: identifying a peripheral region of a laser beam irradiation position; dividing the peripheral region into a plurality of divided regions for each common reflected light information; inferring a layer structure at the laser beam irradiation position from analogy based on an arrangement pattern of the divided regions positioned around the laser beam irradiation position, and setting a laser working condition of a laser beam to be emitted based on the layer structure inferred from analogy.

A laser repair device including: a repair work part which performs repair work by setting a laser irradiation area for a defect part of a multi-layer film substrate and irradiating the defect part with a laser beam under a set laser working condition, wherein the repair work part identifies a peripheral region of a laser beam irradiation position, divides the peripheral region into a plurality of divided regions for each common reflected light information, infers a layer structure at the laser beam irradiation position from analogy based on an arrangement pattern of the divided regions positioned around the laser beam irradiation position, and sets the laser working condition of the laser beam to be emitted based on the layer structure inferred from analogy.

DESCRIPTION OF EMBODIMENTS

Figure 1:
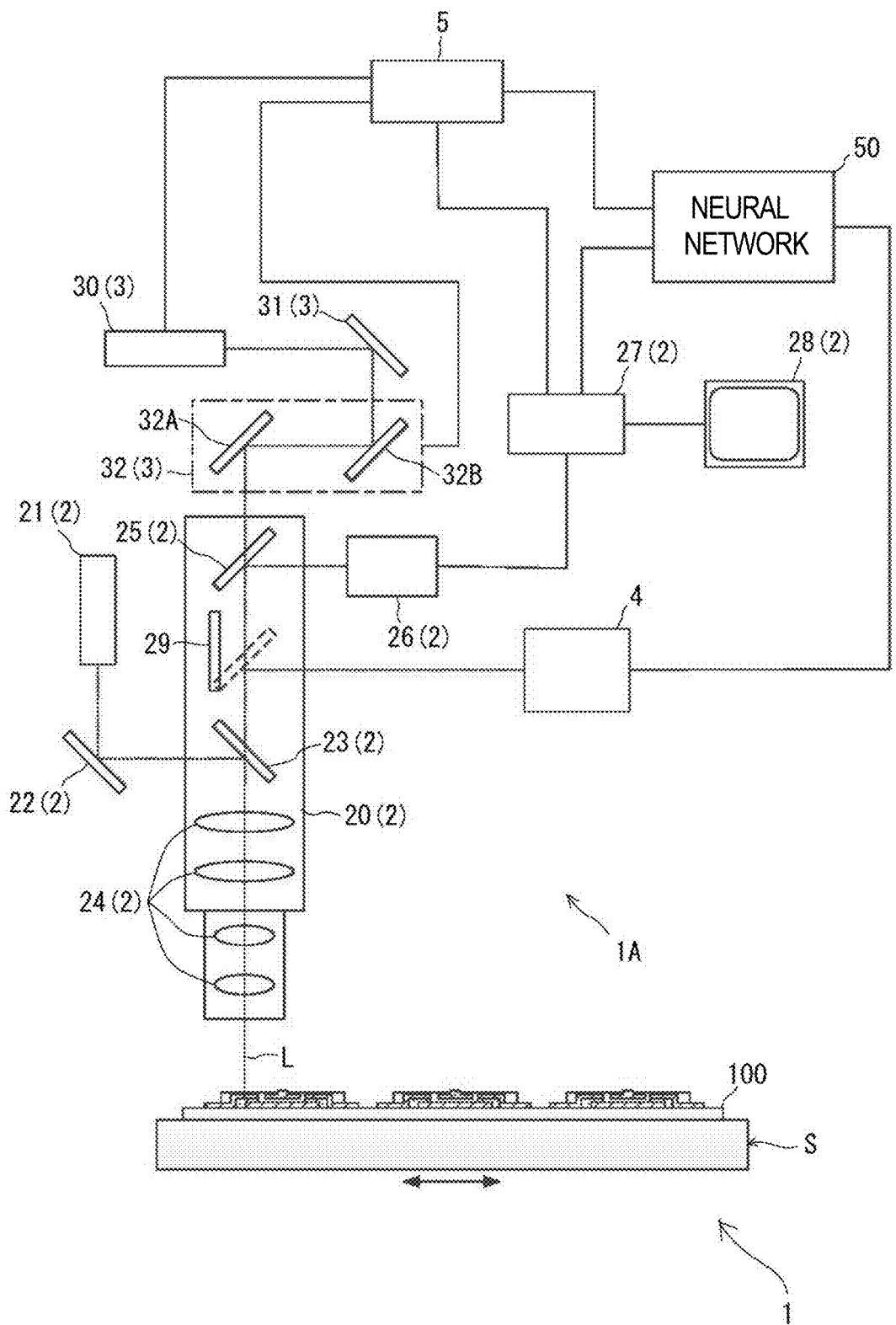
FIG. 1 is an explanatory view showing an example of the configuration of a device (laser repair device) for executing a laser repair method.

Hereinbelow, an embodiment of the present invention will be described with reference to the drawings. In the following description, the same reference numerals in different drawings denote portions having the same function, and the duplicate description thereof in each drawing will be omitted appropriately.

In a laser repair method according to the embodiment of the present invention, a surface of a multi-layer film substrate such as a TFT (Thin Film Transistor) is irradiated with a laser beam, and repair work is performed on a defect part.

FIG. 1 shows an example of a device (laser repair device) for executing the laser repair method according to the embodiment of the present invention. A laser repair device 1 includes a repair work part 1A which irradiates a surface of a multi-layer film substrate 100 placed on a stage S which moves on a horizontal plane with a laser beam L, and the repair work part 1A includes an image acquiring part 2, a laser radiation part 3, a spectral camera 4, and a laser control part 5.

The image acquiring part 2 includes, e.g., a microscope 20, a white light source 21, and an imaging camera 26, acquires a surface image of the multi-layer film substrate 100 via the microscope 20, and acquires a defect part image in the case where a defect part is present in the multi-layer film substrate 100. The surface of the multi-layer film substrate 100 is irradiated with white incident light from the white light source 21 via a mirror 22, a half mirror 23, and a lens system 24, and the light reflected on the surface of the multi-layer film substrate 100 forms an image on an imaging surface of the imaging camera 26 via the lens system 24, the half mirror 23, and a half mirror 25. An image imaged by the imaging camera 26 is subjected to appropriate image processing in an image processing part 27, and is displayed in a display device 28 as an enlarged image enlarged with an appropriate magnification.

The laser radiation part 3 includes, e.g., a laser beam source 30 and a laser scanner 32, and irradiates the surface of the multi-layer film substrate 100 with the laser beam L through the microscope 20. The laser beam emitted from the laser beam source 30 enters the microscope 20 via a mirror 31 and the laser scanner 32 constituted by galvanometer mirrors 32A and 32B and passes through an optical system in the microscope 20, and the surface of the multi-layer film substrate 100 is irradiated with the laser beam.

The spectral camera 4 acquires a spectral image as reflected light information of the surface of the multi-layer film substrate 100. The surface of the multi-layer film substrate 100 is irradiated with the white incident light which is emitted from the white light source 21 and is coaxial with the microscope 20, and the reflected light from the surface is reflected by a mirror 29 inserted into the optical axis of the microscope 20, and enters the spectral camera 4. The spectral camera 4 disperses the reflected light from the surface of the multi-layer film substrate 100, and acquires spectrum data of each pixel of the spectral image. Herein, an example in which the spectrum data is acquired as the reflected light information obtained from the defect part image by using the spectral camera 4 is described, but the reflected light information is not limited thereto, and the reflected light information obtained from the defect part image may also be chromaticity data of each pixel.

Herein, the optical axis of the laser beam L in the microscope 20, the optical axis of the image acquiring part 2 in the microscope 20, and the optical axis of the spectral camera 4 in the microscope 20 are coaxial with each other. With this, it is possible to always set an irradiation position of the laser beam L in a monitor screen of the display device 28, and it is also possible to make a monitor image of the display device 28 and the spectral image of the spectral camera 4 coaxial with each other.

Figure 2:
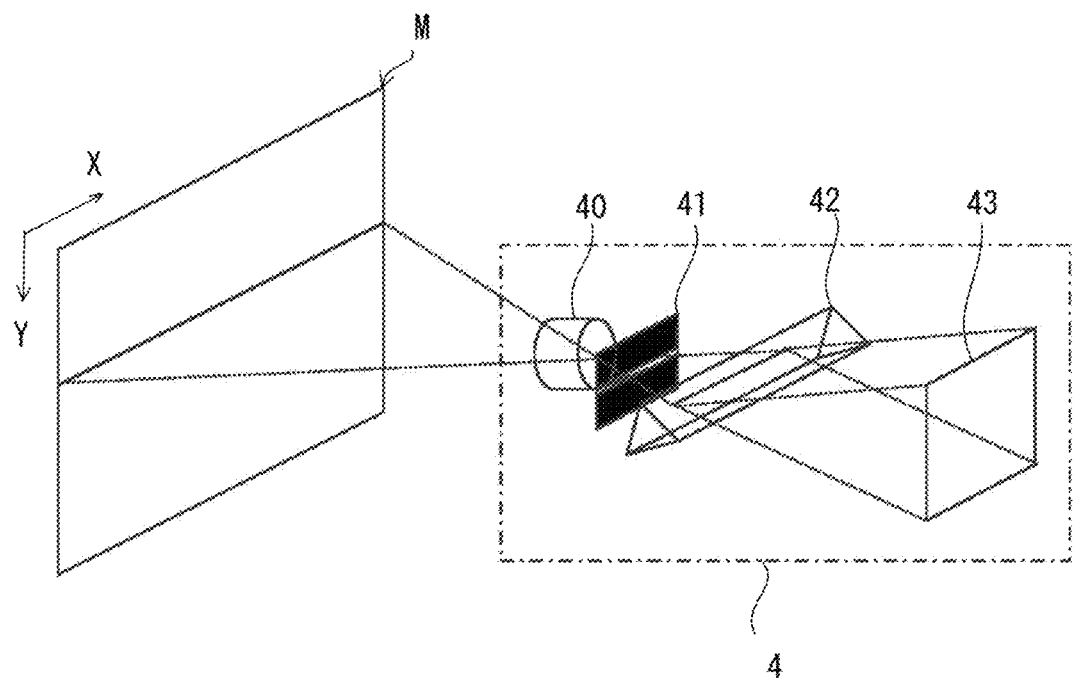
FIG. 2 is an explanatory view showing an example of the configuration of a spectral camera and the function thereof.
Figure 2:
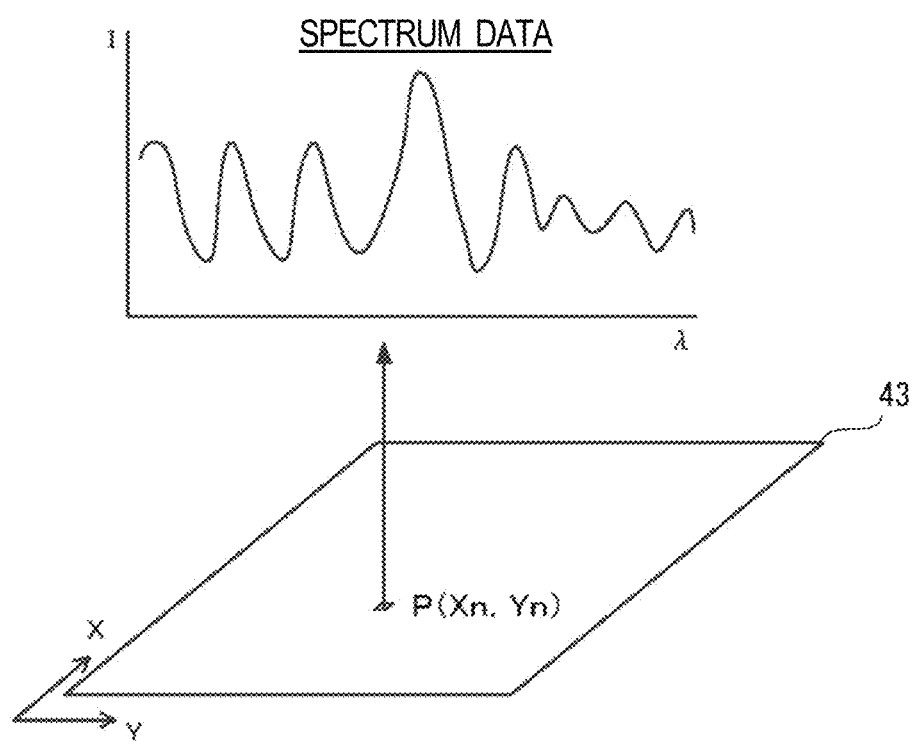

As shown in FIG. 2, the spectral camera 4 includes, e.g., a lens 40, a slit 41, a spectroscope 42, and a two-dimensional sensor 43, disperses reflected light corresponding to one line in an X direction on a measured surface M in a direction perpendicular to the reflected light according to line spectroscopy, and detects spatial information in the X direction and spectral data in the two-dimensional sensor 43. Subsequently, by performing a scan with the reflected light corresponding to one line in a Y direction on an as needed basis, one piece of spectrum data is obtained for each pixel (Xn, Yn) of the resolution of the two-dimensional sensor 43 in X-Y directions.

The laser control part 5 performs control for setting a laser irradiation area on the surface of the multi-layer film substrate 100 including the defect part, and irradiating the defect part with the laser beam under the set laser working condition. The laser control part 5 is controlled according to the setting of a learned neural network 50. The spectrum data of each pixel of the spectral image acquired by the spectral camera 4 is input to the neural network 50 as the reflected light information, and the neural network 50 sets the laser working condition of the laser beam with which the defect part is irradiated for each pixel of the spectral image based on the input spectrum data.

The neural network 50 performs analogy of the layer structure of the multi-layer film substrate 100 from the spectrum data serving as the reflected light information in order to set the laser working condition. The concept of the layer structure analogy performed by the neural network 50 will be described by using FIG. 3.

Figure 3A:
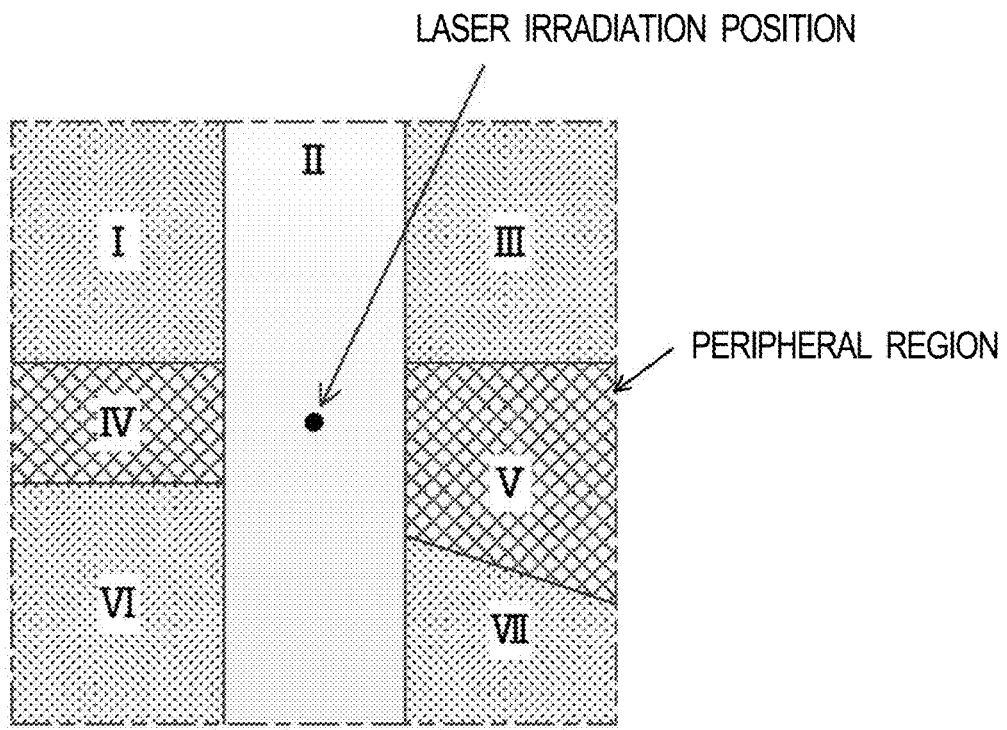
FIG. 3(a) is an explanatory view for explaining an analogy method of a layer structure (FIG. 3(a) shows divided regions obtained by dividing a spectral image for each reflected light information).

FIG. 3(a) shows the spectral image acquired from a peripheral region of a set laser beam irradiation position (the optical axis position of the microscope 20). This spectral image has the spectrum data (reflected light information) of each pixel, and it is possible to grasp a pattern of a multi-layer film with a difference in reflected light information by identifying the peripheral region of the laser beam irradiation position and dividing the peripheral region into a plurality of divided regions I to VII for each common spectrum data. In an example shown in the drawing, the divided regions I, III, VI, and VII have similar spectrums, and hence it is possible to understand that the regions have the same layer pattern and, the divided regions IV and V have similar spectrums different from those of the divided regions I, III, VI, and VII, and hence it is possible to understand that the regions have the same layer pattern different from that of the divided regions I, III, VI, and VII.

In contrast, the divided region II has a similar spectrum in its entire region and, in the case where this layer is a metal layer serving as a work object, the reflected light of the surface of the metal layer does not include information on the underlayer, and hence, even when a region having a different layer structure of the underlayer is present in the region, the entire region has the same spectrum. Accordingly, when it is intended that different laser working conditions are set for regions having different underlayers, the analogy of the layer structure is required at the laser irradiation position in the divided region II.

Herein, when the divided regions shown in FIG. 3(a) are obtained from the reflected light information, in the case where a divided region recognized as a region having another layer pattern (e.g., the divided region II) is present between two divided regions recognized as regions having the same layer pattern (e.g., the divided region I and the divided region III), it is inferred from analogy that the same layer pattern is present between the above two divided regions and another layer pattern is stacked on the same layer pattern.

Specifically, in the example shown in FIG. 3(a), it is possible to infer from analogy that the layer of the divided regions I, III, VI, and VII is an exposed region of one layer which uniformly spreads under the layer of the divided region II and the layer of the divided regions IV and V, the layer of the divided region IV and the divided region V is stacked on the above layer to form a layer which extends from the divided region IV to the divided region V, and the layer of the divided region II is formed on the layer so as to cross the layer.

In order to perform the analogy of the layer structure described above automatically with high accuracy, the neural network 50 identifies the peripheral region of the irradiation position of the laser beam, divides the identified peripheral region into a plurality of the divided regions for each common spectrum (reflected light information) based on the input spectrum data, and infers the layer structure at the laser irradiation position from analogy based on the arrangement pattern of the divided regions positioned around the laser irradiation position. Subsequently, based on the layer structure which is inferred from analogy, the neural network 50 sets the laser working condition of the laser beam to be emitted.

Figure 3B:
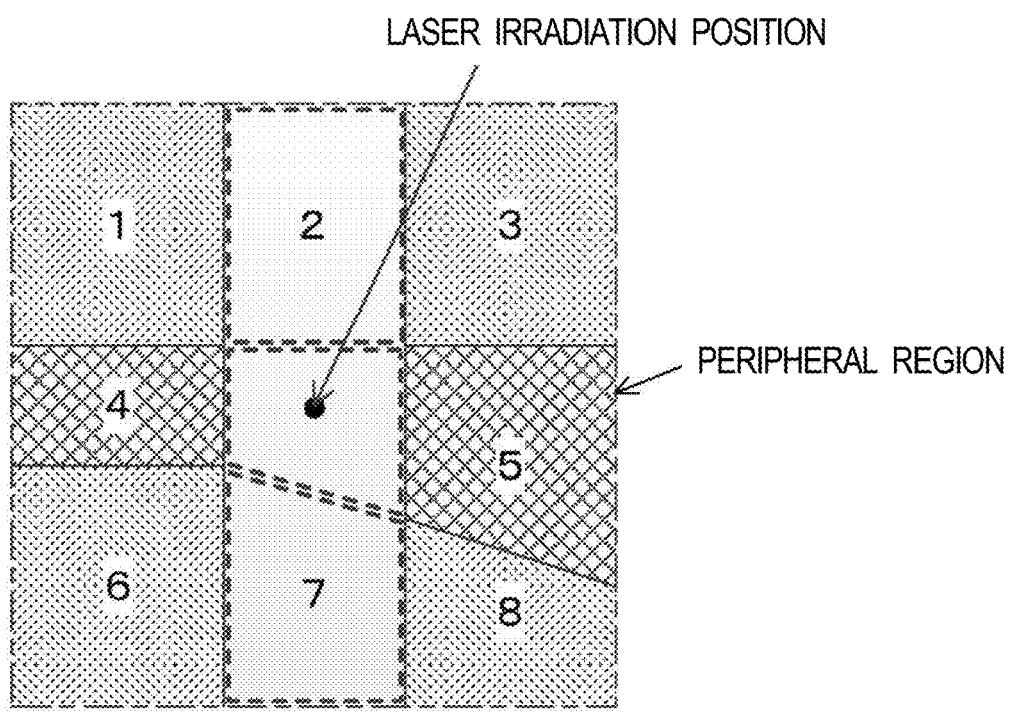
FIG. 3(b) is an explanatory view for explaining an analogy method of a layer structure (FIG. 3(b) shows regions of the layer structure inferred from analogy from an arrangement pattern of the divided regions).

For example, in the case where the arrangement pattern of the divided regions shown in FIG. 3(a) is obtained based on the input spectrum data, as shown in FIG. 3(b), the neural network 50 presumes that a plurality of (eight) divided regions are present around the laser beam irradiation position, divides the divided region II which is recognized as one divided region with the spectrum data (reflected light information) into a plurality of regions having different layer structures of the underlayers, and grasps the plurality of regions. With this, in the examples shown in FIGS. 3(a) and 3(b), the neural network 50 can infer from analogy that the layer structure at the laser irradiation position is a multi-layer structure in which a metal layer exposed in the divided region II is an uppermost layer, a layer exposed in the divided regions IV and V is present under the metal layer, and a layer exposed in the divided regions I, III, VI, and VII is present under the above layer.

Figure 4:
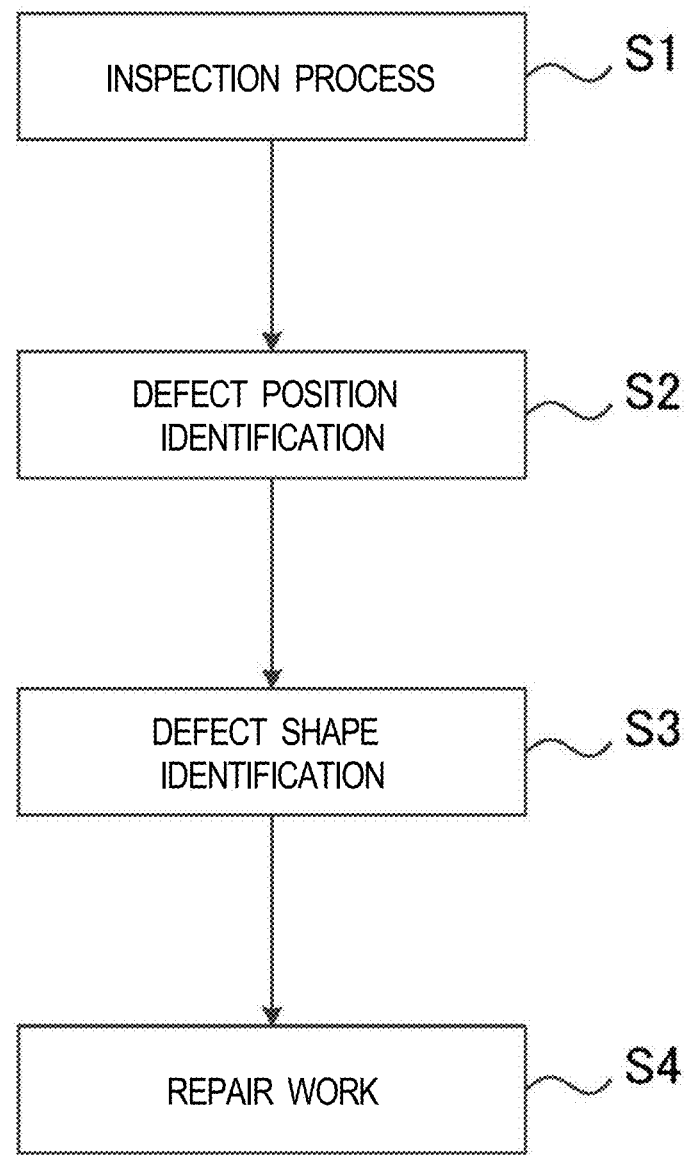
FIG. 4 is an explanatory view for explaining processes of a laser repair method.
Figure 5:
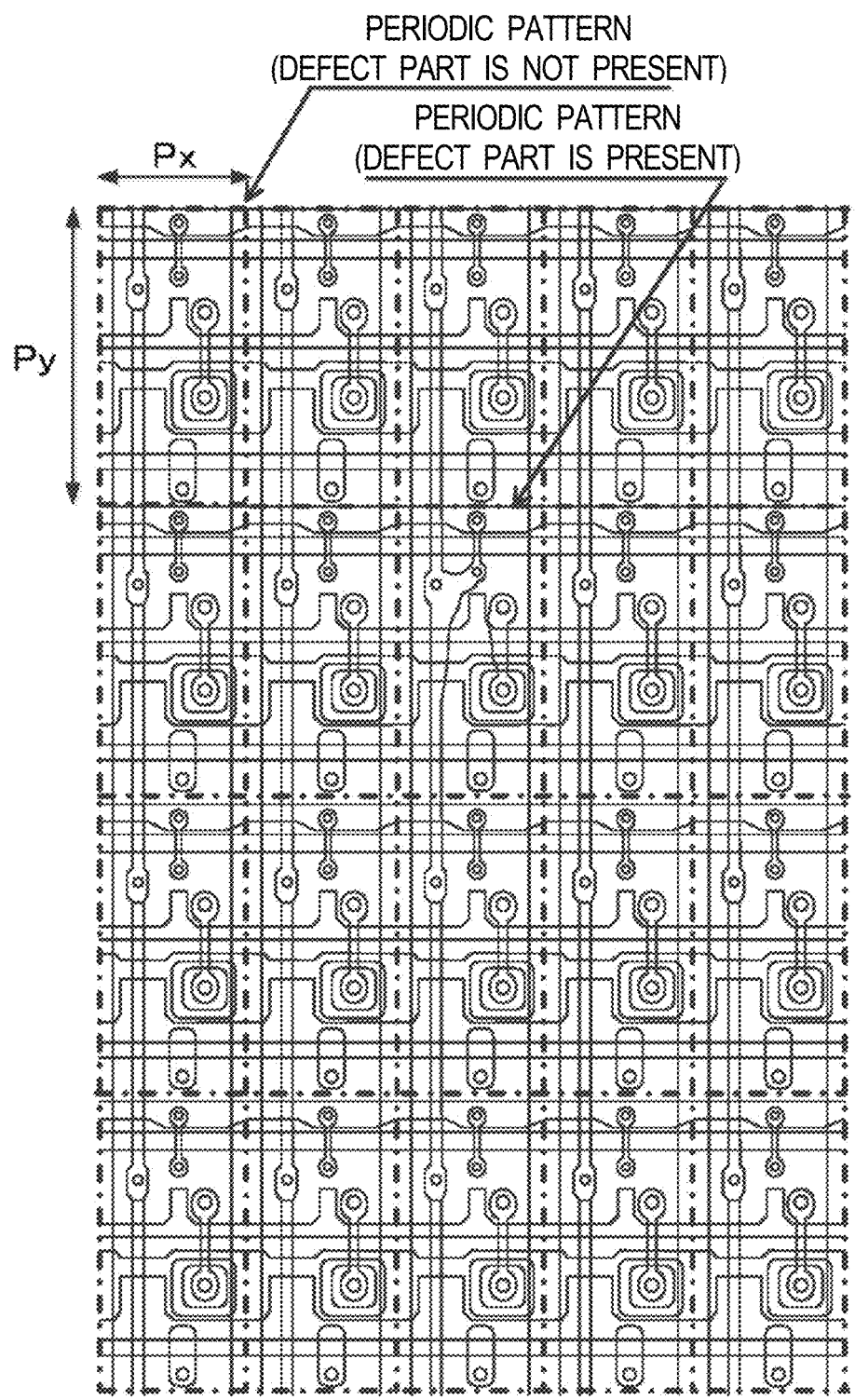
FIG. 5 is an explanatory view showing an example of a periodic pattern of a multi-layer film substrate surface.

Hereinbelow, a description will be given of a specific example of a laser repair method which performs the analogy of the layer structure. As shown in FIG. 4, the laser repair method is performed after an inspection process S1, and has a defect position identification process S2, a defect shape identification process S3, and a repair work process S4. As shown in FIG. 5, the multi-layer film substrate 100 serving as a repair object has a two-dimensional periodic pattern having a periodic pitch Px in an X direction and a periodic pitch Py in a Y direction orthogonal to the X direction. This periodic pattern corresponds to one display pixel in the case where the multi-layer film substrate 100 is a TFT substrate of an FPD.

In the defect position identification process S2, the position of the defect part is identified from the result of the inspection process S1 performed prior to the repair process. At this point, the magnification of the enlarged image acquired in the image acquiring part 2 is set to a low magnification, an image including a plurality of periodic patterns is acquired, the above-described periodic pitches (Px, Py) are identified by performing image processing on the above image in the image processing part 27, and the position of the periodic pattern in which the defect part is present is then identified. Subsequently, the optical axis of the microscope 20 is set to the identified position, the magnification is increased such that the shape of the defect part can be monitored, and the enlarged image in which the defect part is centered is obtained.

In the defect shape identification process S3, the shape of the defect part is identified with the enlarged image in which the defect part is centered. At this point, the image processing part 27 compares a periodic pattern image including the defect part with a periodic pattern image which does not include the defect part, and the shape of the defect part is thereby identified.

Figure 6:
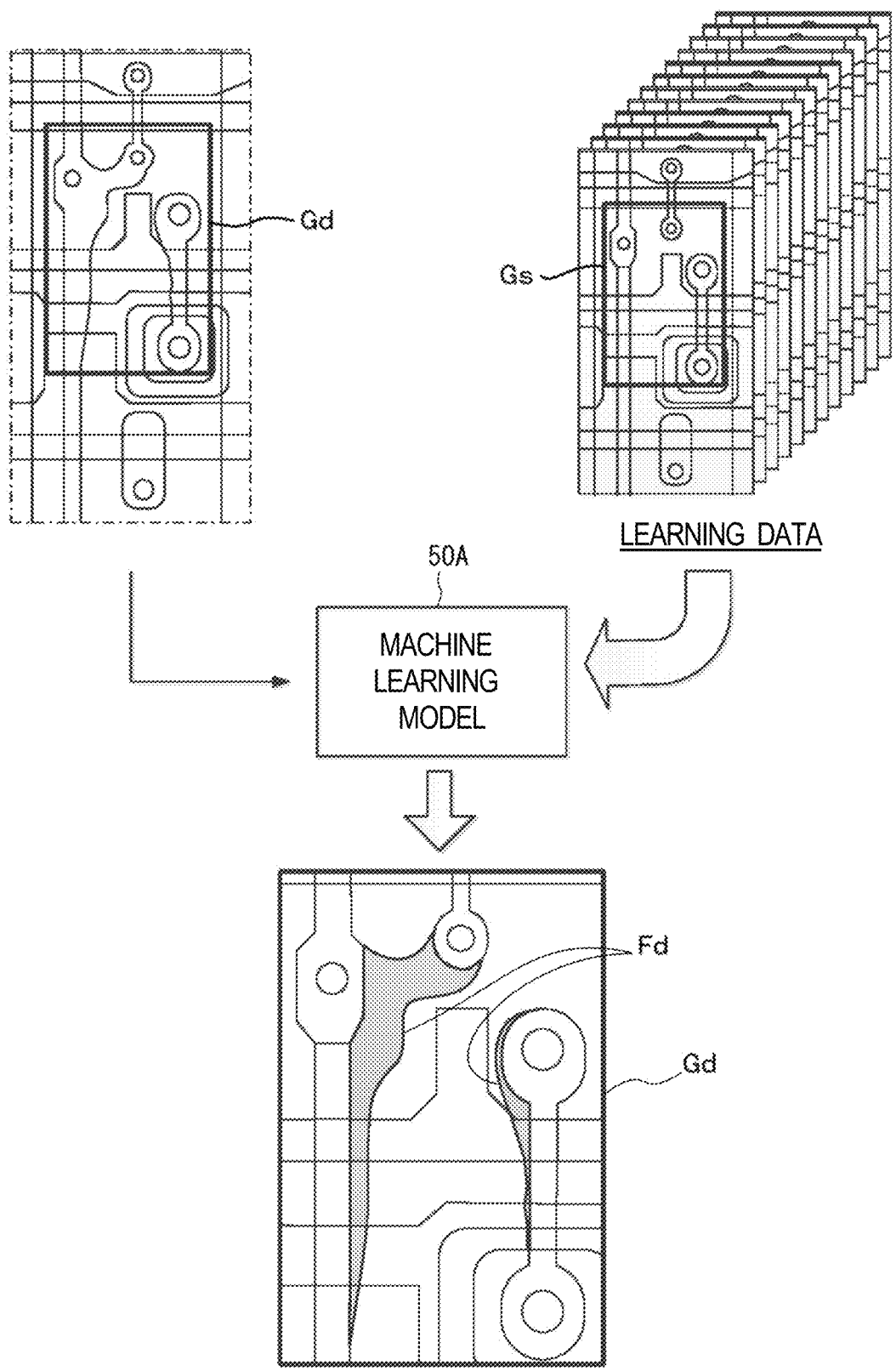
FIG. 6 is an explanatory view for explaining a defect shape identification process.

Also in the identification of the shape of the defect part, it is possible to use the neural network. Specifically, as shown in FIG. 6, a periodic pattern image (an enlarged image in which the defect part is centered) Gd including the defect part is input to a learned machine learning model 50A in the neural network, and the image processing part 27 identifies a shape Fd of the defect part from a periodic pattern image Gs including the defect part based on an output of the machine learning model 50A.

With regard to the periodic pattern, all of the periodic patterns are not formed into the same shape, and the periodic pattern includes a pattern shape deviation. Accordingly, it is difficult to identify the shape of the defect part accurately only by a simple image comparison. By using the learned machine learning model 50A of the neural network, it is possible to increase accuracy in the identification of the shape of the defect part. In the machine learning model 50A, a large number of periodic pattern images Gs acquired by using a test substrate of the multi-layer film substrate 100 serving as the repair object are used as learning data.

Figure 7:
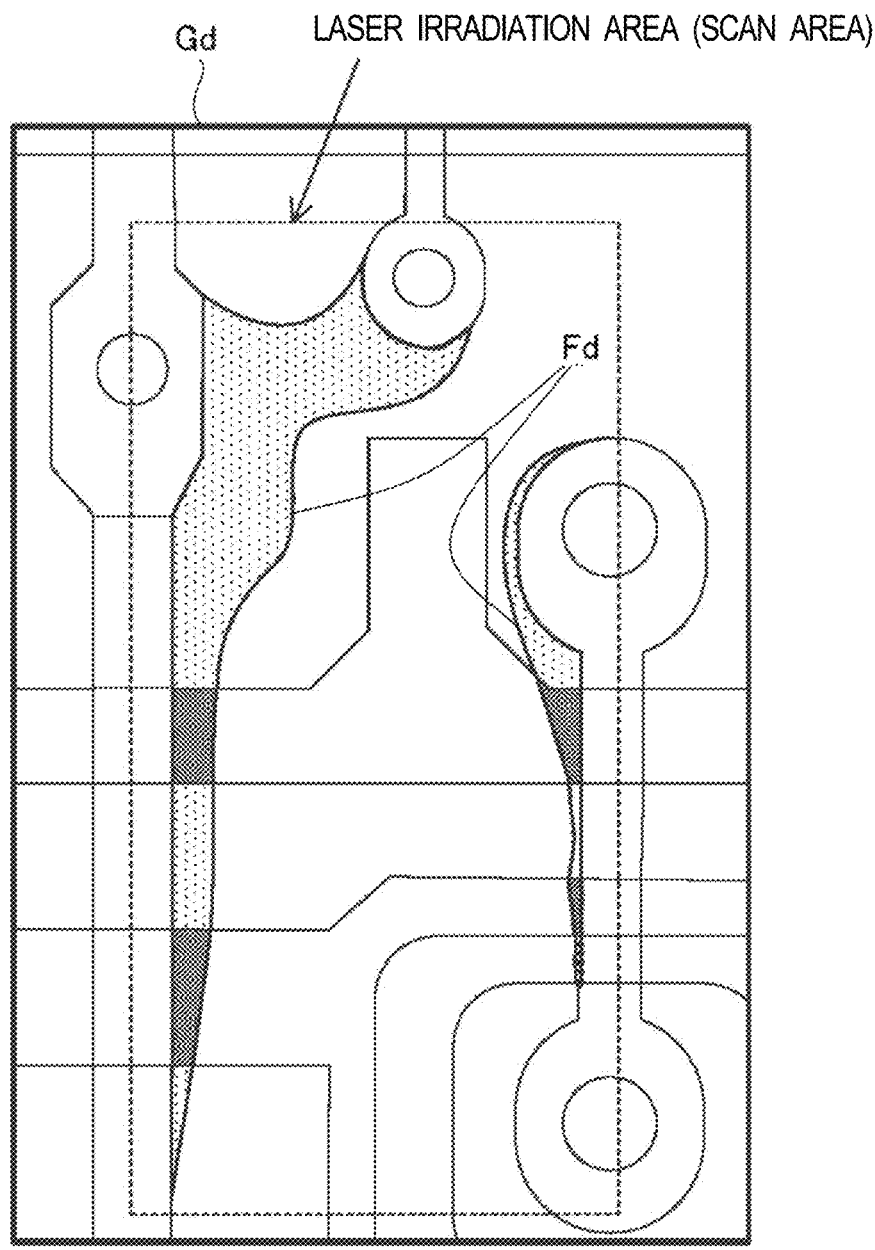
FIG. 7 is an explanatory view for explaining a laser working condition set for each divided region.

In the repair work process S4, as shown in FIG. 7, first, the laser control part 5 sets the laser irradiation area such that the shape of the defect part identified in the image processing part 27 is included. The laser irradiation area is a scan area of the laser scanner 32 and, in the case where the shapes Fd of the defect parts are separate from each other and present at a plurality of locations, the scan area is set so as to include all of the locations.

In the repair work process S4, the spectrum data of each pixel of the defect part image acquired by the spectral camera 4 is input to the neural network 50, and the neural network 50 performs the analogy of the layer structure described above based on the divided regions obtained by the division for each laser irradiation position in the set laser irradiation area, identifies a plurality of divided regions (divided regions A, B, and C) corresponding to a difference in layer structure, and sets the laser working condition (laser work recipes 1 to 3) for each divided region.

In an example shown in FIG. 7, the inside of the defect part image of the shapes Fd is divided into the divided regions A to C having different layer structures, a working condition 1 is set for the divided region A having a given layer structure, a working condition 2 is set for the divided region B having another layer structure, and, further, a working condition 3 is set for the divided region C having a different layer structure.

Figure 8:
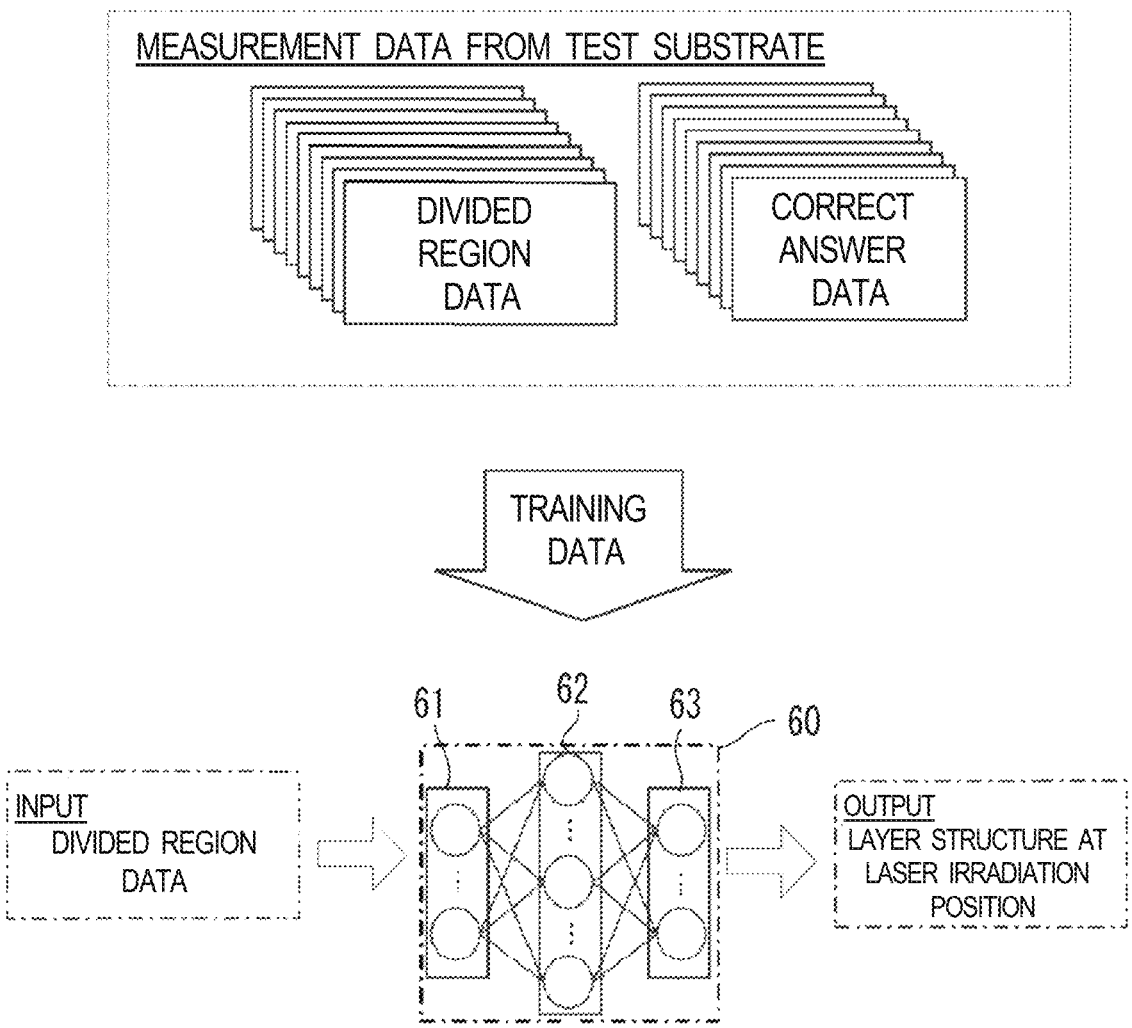
FIG. 8 is an explanatory view showing a relationship between training data of a neural network and input and output thereof.

As shown in FIG. 8, a layer structure analogy neural network 60, which performs the analogy of the layer structure based on the divided regions obtained by the division, has an input layer 61, an intermediate layer 62, and an output layer 63, divided region data which is divided for each laser irradiation position is input, and the layer structure at the laser irradiation position is output. The above-described neural network 50 sets the laser working condition of the laser beam emitted to the laser irradiation position based on the analogy result of the layer structure analogy neural network 60.

As shown in FIG. 8, training data for machine learning of the layer structure analogy neural network 60 includes divided region data obtained by dividing measurement data of the test substrate having the same multi-layer film structure as that of the multi-layer film substrate 100 serving as the repair object, and correct answer data obtained by digitizing the actual layer structure of each divided region. The divided region data and the correct answer data are actually measured in advance for each of periodic patterns (display pixels) of a large number of the test substrates.

Figure 9:
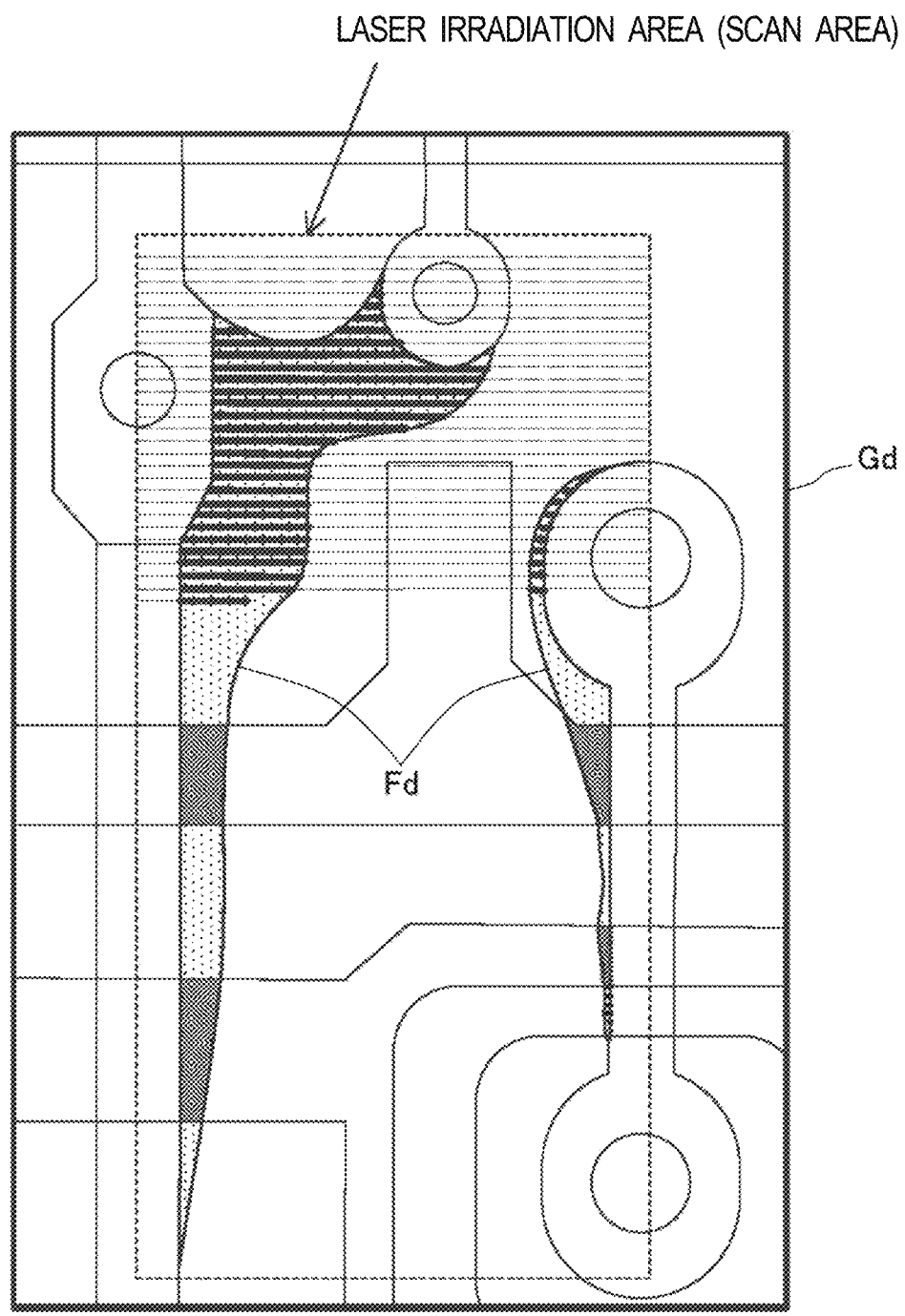
FIG. 9 is an explanatory view for explaining a laser scan in a repair work process.

In execution of repair in the repair work process S4, as shown in FIG. 9, a raster scan in the laser irradiation area (scan area) is performed by the laser scanner 32 and, only in the case where a scan position of a horizontal scan is positioned inside the shape Fd of the defect part, output of the laser beam is turned ON as indicated by thick lines, and work under the working condition which is set in advance for each pixel at the laser irradiation position is performed. In the case where the scan position is outside the defect part, as indicated by broken lines, the output of the laser beam is turned OFF (or reduced).

Figure 10:
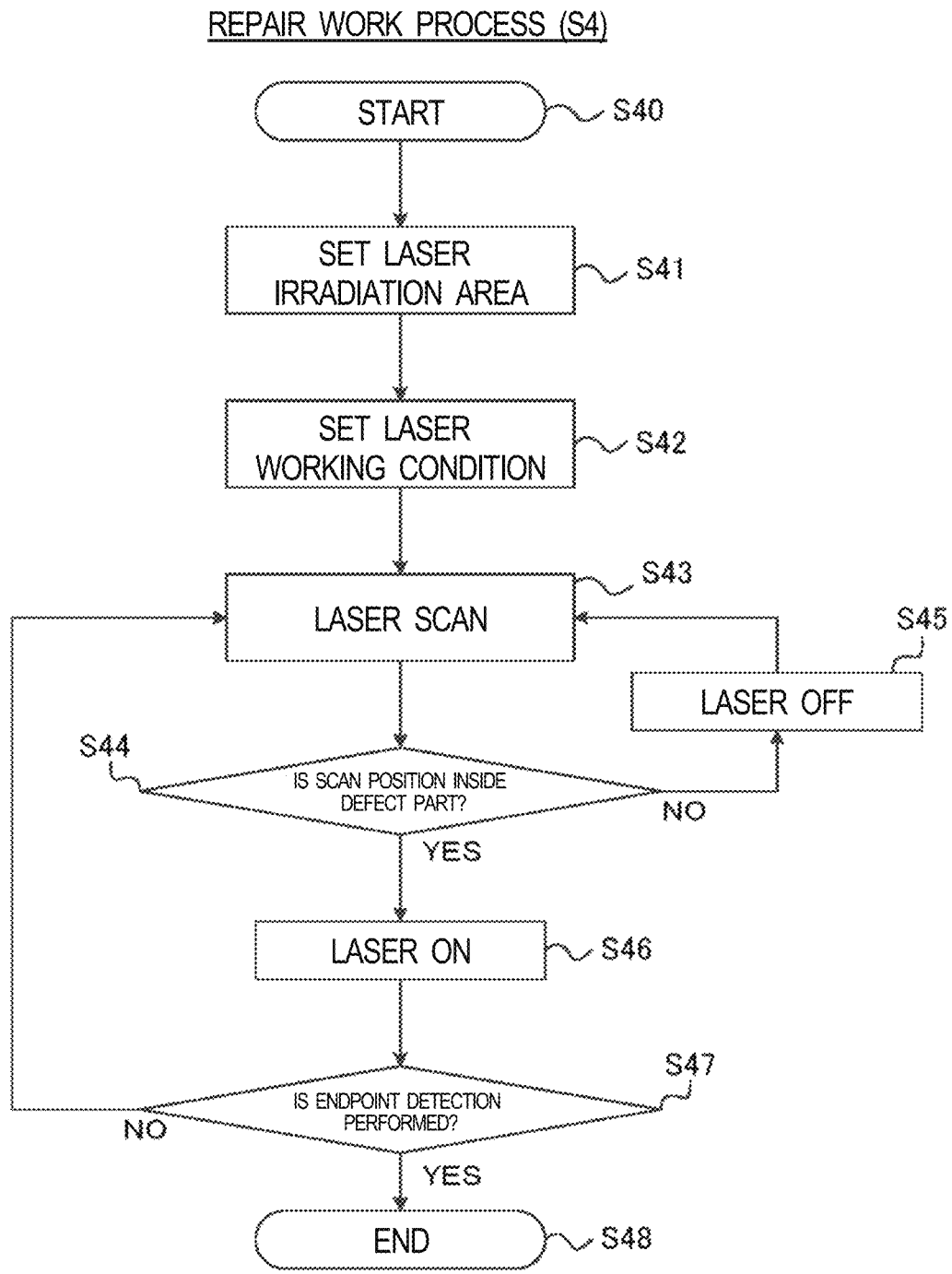
FIG. 10 is an explanatory view showing an operation flow of a laser control part in the repair work process.

In FIG. 10, a description will be given of the operation of the laser control part 5 in the repair work process S4. When the operation is started (S40), as shown in FIG. 7, the laser irradiation area is set for the defect part (S41), and the laser working condition is further set for each set divided region (S42). With this setting, as shown in FIG. 7, the laser irradiation area in the shape Fd of the defect part is divided in advance for each laser working condition.

Thereafter, when the laser scan is started (S43), it is determined whether or not the scan position (the irradiation position of the laser beam) is inside the defect part (S44). The laser beam is turned OFF (S45) in the case where the scan position is outside the defect part (S44: NO), and the laser beam is turned ON (S46) in the case where the scan position is inside the defect part (S44: YES). The laser beam at this point is emitted under the preset laser working condition. The above laser scan (S43) is continued until endpoint detection is performed (S47: NO). Subsequently, in the case where the repair work of the defect part is ended and the end point detection is performed (S47: YES), the operation of the laser control part 5 is ended (S48).

According to the laser repair method which uses the laser repair device 1 described above, it is possible to extract the defect part after inferring the layer film structure of the multi-layer film substrate 100 serving as the repair object from analogy, and perform the laser work only on the defect part under the appropriate working condition. In addition, it is possible to perform the above-described repair work automatically. With this, it is possible to improve operation efficiency as compared with the manual operation of the operator, and obtain constant repair quality without being influenced by the skill of the operator. In addition, in automation of laser repair, even in the case where the layer film structure of the underlayer of the layer serving as the work object differs, it is possible to set the working condition correspondingly to each difference in the layer structure of the underlayer, and appropriately perform the repair work only on the defect part without damaging the peripheral layer or the underlayer of the defect part.

The embodiments of the present invention have been described in detail with reference to the drawings thus far, but the specific configuration is not limited to these embodiments, and design changes and the like made within the scope which does not depart from the gist of the present invention are included in the present invention. In addition, the embodiments described above can be combined with each other by taking advantage of mutual techniques unless specific contradictions or problems are found in the objects, the configurations, and the like.

REFERENCE SIGNS LIST

1 Laser repair device
1A Repair work part
2 Image acquiring part
20 Microscope
21 White light source
22, 29, 31 Mirror
23, 25 Half mirror
24 Lens system
26 Imaging camera
27 Image processing part
28 Display device
3 Laser radiation part
30 Laser beam source
32 Laser scanner
32A, 32B Galvanometer mirror
4 Spectral camera
40 Lens
41 Slit
42 Spectroscope
43 Two-dimensional sensor
5 Laser control part
50, 60 Neural network
50A Machine learning model
61 Input layer
62 Intermediate layer
63 Output layer
100 Multi-layer film substrate
S Stage
L Laser beam

What is claimed is:

1. A laser repair method which performs repair work by setting a laser irradiation area for a defect part of a multi-layer film substrate and irradiating the defect part with a laser beam under a set laser working condition, the laser repair method comprising:
   identifying a peripheral region of a laser beam irradiation position;
   dividing the peripheral region into a plurality of divided regions based on reflected light information of each pixel in a defect part image;
   inferring a layer structure at the laser beam irradiation position from analogy based on an arrangement pattern of the divided regions positioned around the laser beam irradiation position, and setting a laser working condition of a laser beam to be emitted based on the layer structure inferred from analogy.

2. The laser repair method according to claim 1, wherein the reflected light information is spectrum data acquired for each pixel in the defect part image.

3. The laser repair method according to claim 2, wherein the laser working condition is set for each pixel in the defect part image.

4. The laser repair method according to claim 1, wherein
the analogy of the layer structure is performed by a learned neural network, and
the neural network is subjected to machine learning by using, as training data, divided region data obtained by dividing measurement data of a test substrate having a multi-layer film structure identical to a multi-layer film structure of the multi-layer film substrate serving as a repair object, and correct answer data obtained by digitizing an actual layer structure of each of the divided regions.

5. The laser repair method according to claim 1, wherein
the multi-layer film substrate has a two-dimensional periodic pattern,
a position of the defect part is identified from a result of an inspection process performed prior to a repair process,
a shape of the defect part is identified by comparing a periodic pattern image including the defect part with a periodic pattern image which does not include the defect part, and
the laser irradiation area is set so as to include the identified shape of the defect part.

6. A laser repair device comprising:
a repair work part which performs repair work by setting a laser irradiation area for a defect part of a multi-layer film substrate and irradiating the defect part with a laser beam under a set laser working condition, wherein
the repair work part:
identifies a peripheral region of a laser beam irradiation position,
divides the peripheral region into a plurality of divided regions based on reflected light information of each pixel in a defect part image,
infers a layer structure at the laser beam irradiation position from analogy based on an arrangement pattern of the divided regions positioned around the laser beam irradiation position, and
sets a laser working condition of a laser beam to be emitted based on the layer structure inferred from analogy.

7. The laser repair device according to claim 6, wherein the repair work part includes:
an image acquiring part which acquires the defect part image via a microscope;
a laser radiation part which irradiates the defect part with a laser beam through the microscope;
a spectral camera which irradiates the multi-layer film substrate with white incident light coaxial with the microscope, disperses reflected light from the multi-layer film substrate, and acquires spectrum data of each pixel; and
a laser control part which sets the laser working condition, and
the laser control part sets the laser working condition for each pixel in the defect part image by using the spectrum data as the reflected light information.

8. The laser repair device according to claim 6, wherein
the repair work part includes a learned neural network which performs the analogy of the layer structure, and
the neural network is subjected to machine learning by using, as training data, divided region data obtained by dividing measurement data of a test substrate having a multi-layer film structure identical to a multi-layer film structure of a multi-layer film substrate serving as a repair object, and correct answer data obtained by digitizing an actual layer structure of each of the divided regions.

\* \* \* \* \*